United States Patent [19]

Jones et al.

[11] 3,961,274

[45] June 1, 1976

[54] NOISE RIDING THRESHOLD

[75] Inventors: Robert W. Jones, San Diego; James K. Hall, Santee, both of Calif.

[73] Assignee: The United States of America as represented by the Secretary of the Navy, Washington, D.C.

[22] Filed: Mar. 10, 1975

[21] Appl. No.: 557,191

[52] U.S. Cl. ............................ 328/165; 307/235 R; 307/264; 328/162; 328/167
[51] Int. Cl.² ...................... H03B 1/04; H03K 5/08; H04B 1/10
[58] Field of Search ......... 307/235 J, 235 R, 235 K, 307/235 N, 235 T, 264; 328/162, 163, 165, 167, 149

[56] References Cited
UNITED STATES PATENTS

| | | | |
|---|---|---|---|
| 3,311,835 | 3/1967 | Richman | 307/235 T |
| 3,548,206 | 12/1970 | Ogle et al. | 307/235 T |
| 3,706,045 | 12/1972 | Salvert | 328/165 |
| 3,737,790 | 6/1973 | Brown | 307/235 J |

Primary Examiner—John Zazworsky
Attorney, Agent, or Firm—R. S. Sciascia; G. J. Rubens; H. Fendelman

[57] ABSTRACT

A network for sensing video noise power over a wide dynamic range and outputting a voltage proportional to that noise power. The input signal is filtered, inverted and rectified to separate the noise component from the signal. The noise component is then converted to a negative level voltage which is added to first and second preset voltages. A non-linear output voltage which is a function of the first signal sum is provided for driving the voltage threshold devices in external equipment. A linear voltage output which is a function of the second signal sum is also provided for driving the voltage threshold devices of external equipment.

12 Claims, 1 Drawing Figure

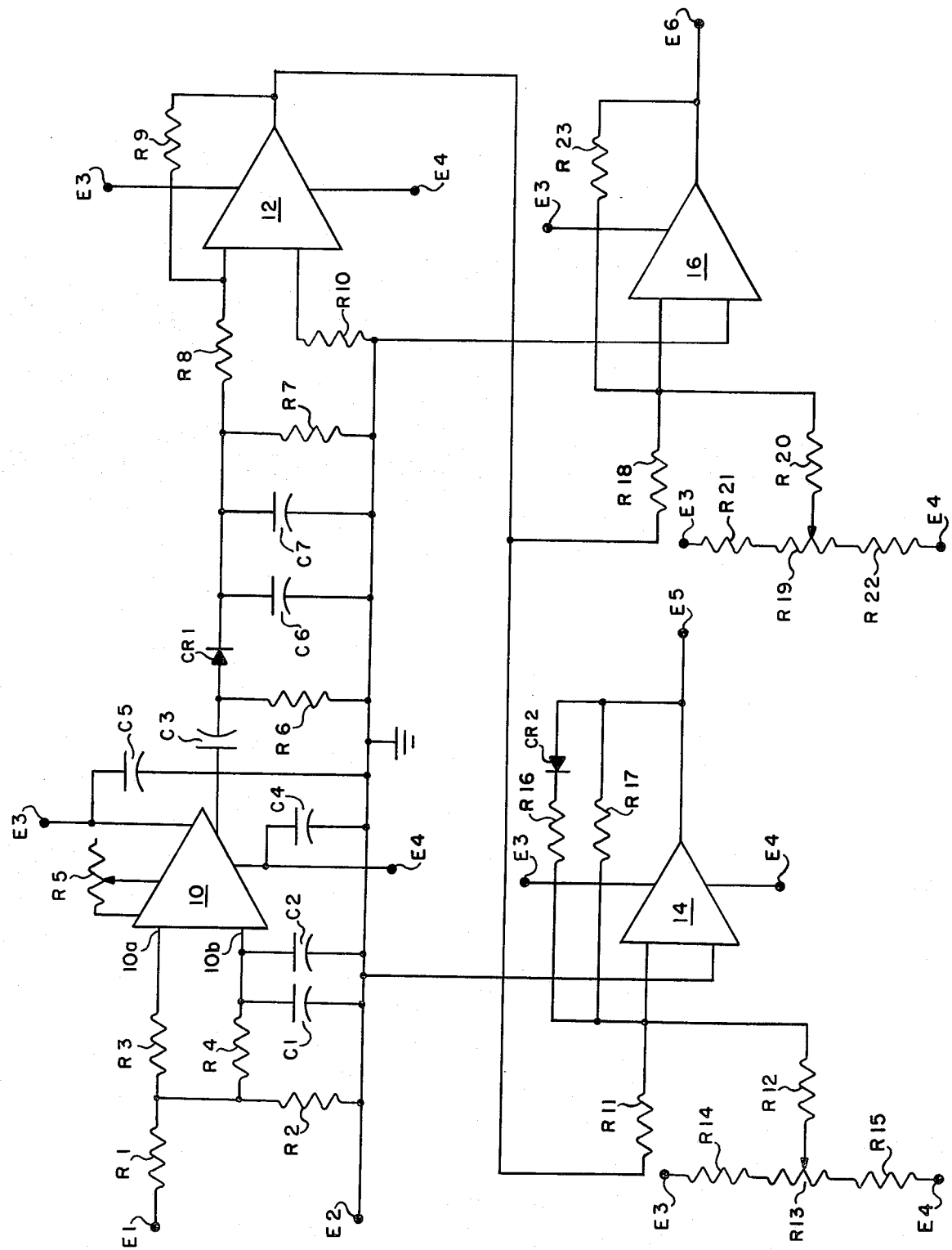

NOISE RIDING THRESHOLD

BACKGROUND OF THE INVENTION

Many devices have incorporated circuits to accomplish automatic gain control (AGC) and to eliminate background noise (SQUELCH), the circuits being designed to send signal power and adjust receiver gain accordingly to prevent saturation or to enable audio presentation. Both circuit types, however, work with relatively constant noise power while existing receivers have manual gain controls which vary noise power over a wide dynamic range.

SUMMARY OF THE INVENTION

The present invention relates to a network that is designed to be insensitive to signal video while sensing random noise voltages and providing output voltages suitable for use in automatically adjusting threshold voltages of receivers above the noise spikes. In conducting electronic warfare operations, there exists a need of being able to automatically and reliably measure the parameters of pulse signals of varying strength in the presence of noise. Existing receivers use manual gain controls which affect system noise levels and degrade any parameter measurements. The present invention relates to a device capable of utilizing these receiver outputs and providing output voltages suitable for adjusting the receiver threshold voltages such that automatic pulse parameter measurements can be made. The network of the present invention is capable of performance over a wide dynamic range of input noise power, does not respond to positive video signals, and provides an automatic function such that an operator may be relieved from a difficult manual task. The circuit additionally may utilize existing power and space.

STATEMENT OF THE OBJECTS OF THE INVENTION

It is the primary object of the present invention to disclose a novel means for automatically adjusting threshold voltages.

It is another object of the present invention to disclose a network that is insensitive to signal video while sensing random noise voltages and outputting voltages for use in automatically adjusting threshold voltages above noise spikes.

Other objects, advantages and novel features of the invention will become apparent from the following detailed description of the invention when considered in conjunction with the accompanying drawings.

BRIEF DESCRIPTION OF THE DRAWINGS

The sole FIGURE is a network diagram of the present invention.

DESCRIPTION OF THE PREFERRED EMBODIMENT

As illustrated in the drawing the network of the present invention has four stages: an input inverting stage including video amplifier 10, a DC unity gain inverter section including inverter 12, a high level converter section including converter 14 and low level converter section including converter 16.

The inverting video amplifier section has input terminals E1 and E2, which is at ground potential, which receive the input video signal typically from a microwave receiver. A voltage divider comprised of resistors R1, R2 and R3 reduces the signal and DC input power to a level suitable for inverter amplifier 10. Filter network comprised of resistor R4 and capacitors C1 and C2 is designed to filter out the noise and video components of the input signal such that only the DC component of the input signal is present at the bottom input of inverter amplifier 10. Inverter amplifier 10 is provided with variable resistance R5 for gain adjustment, positive voltage supply E3, negative voltage supply E4 and power line filters C4 and C5.

The DC unity gain inverter section receives its input from the inverting video amplifier section and includes a coupling network comprised of capacitor C3 and resistor R6 which removes the DC component. The amplified noise signal passes through rectifier CR1 and a smoothing filter comprised of shunt capacitors C6 and C7 and shunt resistor R7 which is connected to inverter amplifier 12 by resistor R8. Inverter amplifier 12 is provided with positive and negative power supplies E3 and E4, respectively, feedback resistor R9 and connecting resistor R10.

Amplifier 14 of the high level converter section is connected to the output of inverter amplifier 12 by resistor R11. The other input of amplifier 14 is connected to ground as illustrated. Positive power supply E3 and negative power supply E4 are used to energize amplifier 14 which receives a preset voltage input through resistor R12 from manually adjustable resistor R13 connected between the positive and negative voltage supplies E3 and E4 through resistors R14 and R15. A non-linear feedback network including the serial connection of rectifier CR2 and resistor R16 in parallel with resistor R17 is connected between the output and one of the inputs of amplifier 14.

Amplifier 16 of the low level converter section is connected to the output of inverter amplifier 12 by resistor R18 and is connected to the voltage supply E3. Amplifier 16 has its top input connected to power supply; E4 through manually adjustable resistor R19 and resistor R20. As illustrated, resistors R21 and R22 connect the variable resistor R19 to the positive and negative voltage supplies. A linear feedback path is provided from the output terminal of amplifier 16 to one of the input terminals and is comprised of resistor R23.

The operation of the device is as follows. The outputs of the high and low level converter sections E5 and E6 are preset to first and second voltage levels, e.g., +30 millivolts and +20 millivolts, respectively, with the input E1 disconnected by using manually adjustable resistors R13 and R19. The input signal at E1 is reduced by the voltage divider network R1, R2. Resistors R3 and R4 isolate the inverter 10 inputs, 10a and 10b. Input 10b of inverter 10 is held at a DC level by the filter capacitors C1 and C2 so that the differential video amplifier 10 can be DC coupled and respond to input video only at the inverting input 10a. Inverting differential amplifier 10 thus substantially removes the DC component from the input signal and inverts the signal. The DC component is removed by capacitor C3. The inverted signal is subsequently rectified by rectifier CR1. The positive input video pulses would be negative at the input to CR1 and would, therefore, not be passed through CR1. Only the input negative noise spikes, which are positive at CR1, are detected and subsequently filtered by C6, C7 and R7, resulting in a positive DC voltage (VDC) input to resistor R8 at the input of inverter amplifier 12. Inverter amplifier 12 inverts the positive level noise signal and outputs a negative level noise signal to resistors R11 and R15 such that the negative level noise signal is added to the initial preset voltages through resistors R12 and R18, respectively. The first two stages including inverting video amplifier 10 and inverter amplifier 14 thus function as an isolation means for receiving an input signal having signal, D.C. and noise components and for outputting a negative level D.C. voltage proportional to the average value of the negative portion of the input signal noise component. The high level converter stage including amplifier 14 uses resistor R17 in parallel with resistor R16 and rectifier CR2 as the feedback path to generate a non-linear output E5 as a function of the negative level DC noise signal. Feedback resistor R21 acts to develop a linear output E6 from the low level converter 16. The output terminals E5 and E6 now have voltages for setting the threshold levels of external equipment at values above the noise level or at any value as desired.

Obviously many modifications and variations of the present invention are possible in the light of the above teachings. It is therefore to be understood that within the scope of the appended claims the invention may be practiced otherwise than as specifically described.

What is claimed is:

1. A network comprising:
   isolation means for receiving an input signal having signal, DC and noise components and for outputting a negative level DC voltage proportional to the average value of the negative portion of said input signal noise component; and
   output means connected to said isolation means for adding a preset voltage to said negative level DC voltage and for providing a threshold voltage.

2. The network of claim 1 wherein said output means comprises:
   a first output means for adding a first preset voltage to said negative level DC voltage and for outputting a first threshold voltage which is a non-linear function of said negative level DC voltage; and
   second output means for adding a second preset voltage to said negative level DC voltage and for outputting a second threshold voltage which is a linear function of said negative level DC voltage.

3. The network of claim 2 wherein:
   said first output means comprises a first output amplifier having an input connected to its output by a first feedback network; and
   said second output means comprises a second output amplifier having an input connected to its output by a second feedback network.

4. The network of claim 3 wherein:
   said first output means further comprises a first manually adjustable resistor connected to a voltage supply for providing said first preset voltage; and
   said second output means further comprises a second manually adjustable resistor connected to a voltage supply for providing said second preset signal.

5. The network of claim 4 wherin said isolation means comprises:
   first means for receiving said input signal having signal, DC and noise components and for outputting a signal proportional to said input signal;
   second means connected to said first means for filtering out the signal and noise components of said input signal;
   third means having first and second inputs connected to said first and second means, respectively, for outputting a third means output signal which is the inverted difference between the signals at its first and second inputs;
   fourth means connected to said third means for outputting the negative noise component of said signal proportional to said input signal as a positive level noise signal; and
   fifth means connected to said fourth means for inverting said positive level noise signal to provide said negative level noise signal.

6. The network of claim 5 wherein said first means comprises a voltage divider network.

7. The network of claim 6 wherein said second means comprises an R-C network connected to said voltage divider network having a first resistor (R4) connected to said voltage divider network and having first and second capacitors connected between said first resistor and said third means.

8. The network of claim 7 wherein said third means comprises an inverting differential amplifier.

9. The network of claim 8 wherein said fourth means comprises a diode.

10. The network of claim 9 further including first filter means connected between said inverting differential amplifier and said diode for filtering any DC component in said third means output signal.

11. The network of claim 10 wherein said fourth means further comprises second filter means for smoothing said positive level noise signal.

12. The network of claim 1 wherein said isolation means comprises:
   first means for receiving said input signal having signal, DC and noise components and for outputting a signal proportional to said input signal;
   second means connected to said first means for filtering out the signal and noise components of said input signal;
   third means having first and second inputs connected to said first and second means respectively for outputting a third means output signal which is the inverted difference between the signals at its first and second inputs;
   fourth means connected to said third means for outputting the negative noise component of said signal proportional to said input signal as a positive level noise signal; and
   fifth means connected to said fourth means for inverting said positive level noise signal to provide said negative level noise signal.

* * * * *